US012812797B2

(12) United States Patent
Park

(10) Patent No.: US 12,812,797 B2
(45) Date of Patent: Nov. 24, 2026

(54) SCREW-TYPE VENT

(71) Applicant: AMOGREENTECH CO., LTD., Gimpo-si (KR)

(72) Inventor: Kyoungtaek Park, Gimpo-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 206 days.

(21) Appl. No.: 18/843,305

(22) PCT Filed: Feb. 17, 2023

(86) PCT No.: PCT/KR2023/002315

§ 371 (c)(1),
(2) Date: Sep. 2, 2024

(87) PCT Pub. No.: WO2023/167451

PCT Pub. Date: Sep. 7, 2023

(65) Prior Publication Data

US 2025/0176116 A1 May 29, 2025

(30) Foreign Application Priority Data

Mar. 2, 2022 (KR) ........................ 10-2022-0026478

(51) Int. Cl.
*H05K 5/02* (2006.01)

(52) U.S. Cl.
CPC .................................. *H05K 5/0213* (2013.01)

(58) Field of Classification Search
None
See application file for complete search history.

(56) References Cited

U.S. PATENT DOCUMENTS 8,814,993 B2 8/2014 Yano
9,332,662 B2 * 5/2016 Yano .................... H05K 5/0216
9,861,000 B2 * 1/2018 Ishii ........................ F21V 31/03
(Continued)

FOREIGN PATENT DOCUMENTS

JP 2012-243536 A 12/2012
KR 10-1208121 B1 12/2012
(Continued)

OTHER PUBLICATIONS

KR Office Action dated Feb. 20, 2024 as received in Application No. 10-2022-0026478.

(Continued)

*Primary Examiner* — Krystal Robinson
(74) *Attorney, Agent, or Firm* — Maschoff Brennan

(57) ABSTRACT

A screw-type vent is disclosed. The disclosed vent comprises: a body (100) having a through-hole vertically penetrating the center thereof; a membrane (200) disposed on top of the through-hole; and a fixing member (300) loaded on the top surface edge of the membrane. The membrane (200) is joined to the body (100) and the fixing member (300) through thermosetting. The disclosed vent has the membrane joined and fixed to the body and the fixing member through thermosetting, and thus the membrane, which is thin, can be loaded and stably fixed at the correct position on the body, and the membrane can effectively prevent infiltration of foreign material and moisture while ensuring air permeability.

16 Claims, 12 Drawing Sheets

(56) References Cited

U.S. PATENT DOCUMENTS

| | | | | |
|---|---|---|---|---|
| 9,919,850 | B2 * | 3/2018 | Bons | B65D 75/5877 |
| 10,420,238 | B2 * | 9/2019 | Uemura | F16J 15/062 |
| 10,529,969 | B2 * | 1/2020 | Ogawa | B65D 77/225 |
| 11,110,381 | B2 * | 9/2021 | Song | B01D 46/40 |
| 11,377,158 | B2 * | 7/2022 | Sato | F16J 13/14 |
| 2011/0027516 | A1 | 2/2011 | Ni et al. | |
| 2012/0048871 | A1 * | 3/2012 | Chiu | H05K 5/0216<br>220/745 |
| 2012/0168453 | A1 * | 7/2012 | Chiu | H05K 5/0216<br>220/745 |
| 2013/0055898 | A1 * | 3/2013 | Yano | H05K 5/0216<br>96/4 |
| 2015/0306529 | A1 * | 10/2015 | Yano | B01D 46/0002<br>96/7 |

FOREIGN PATENT DOCUMENTS

| | | | | |
|---|---|---|---|---|
| KR | 10-1725165 | B1 | 4/2017 | |
| KR | 10-2006573 | B1 | 8/2019 | |
| WO | WO-2020256262 | A1 * | 12/2020 | F01P 11/0209 |

OTHER PUBLICATIONS

KR Office Action dated Jul. 26, 2024 as received in Application No. 10-2022-0026478.

* cited by examiner

[FIG. 1]
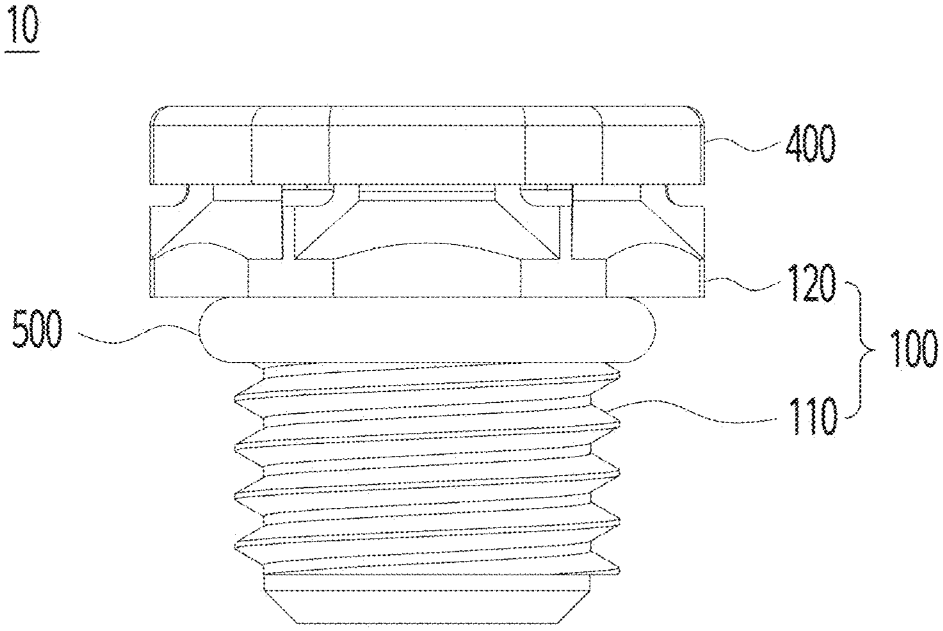

[FIG. 2]
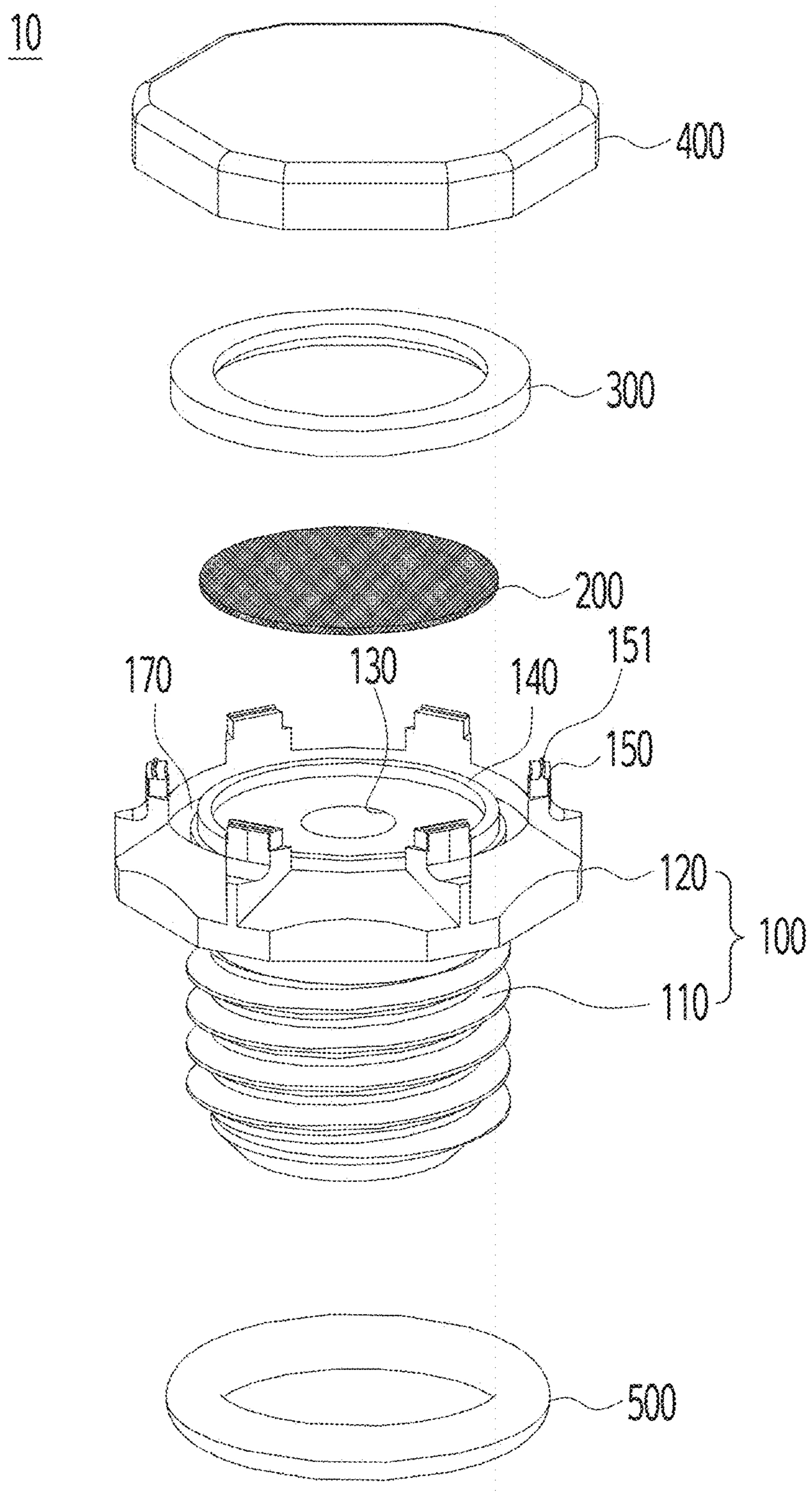

[FIG. 3]
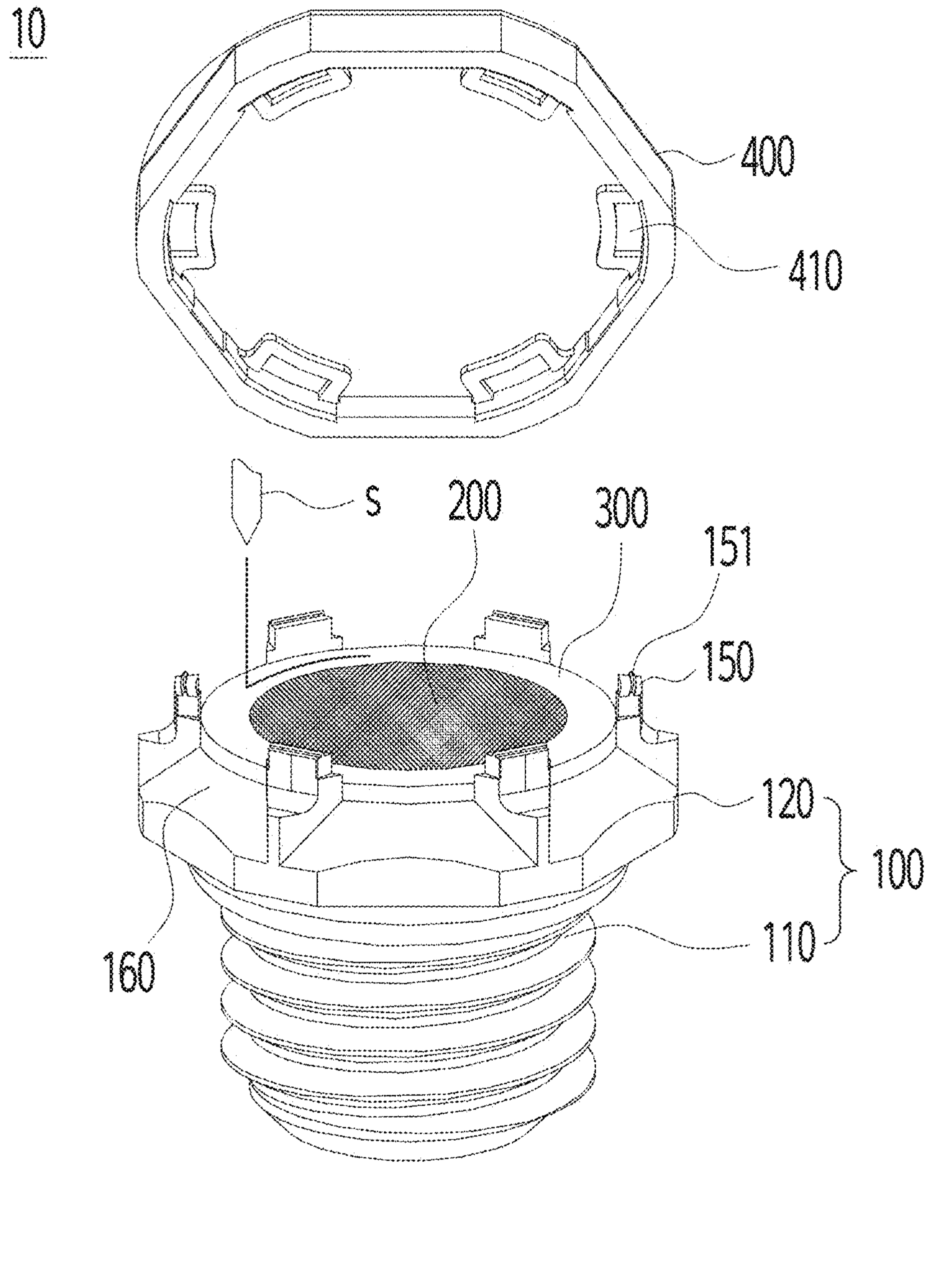

[FIG. 4]
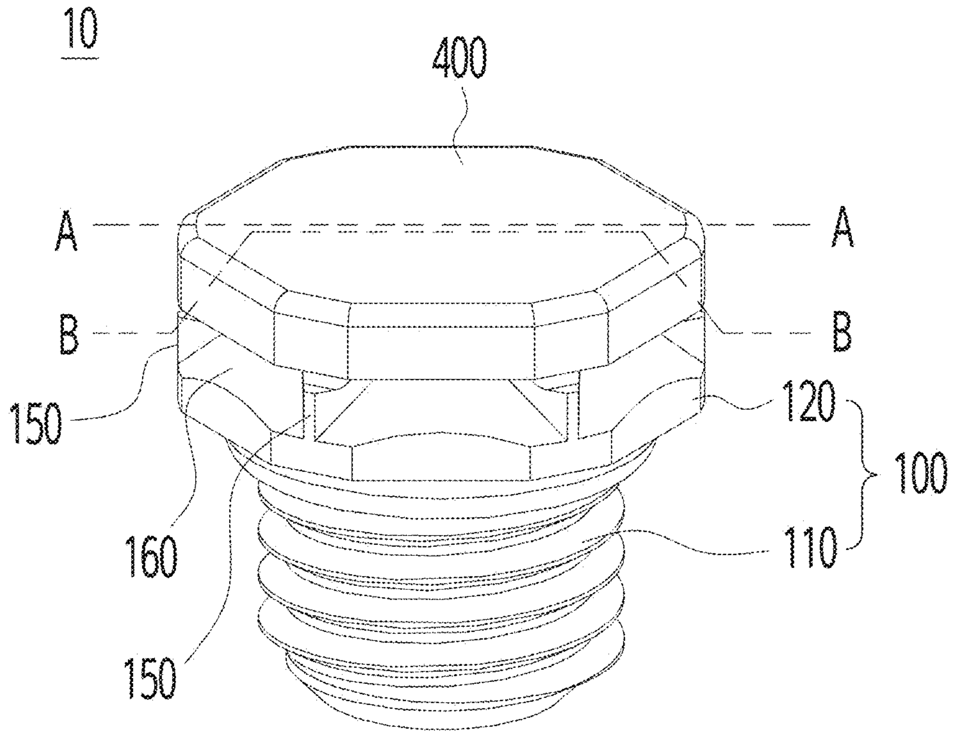

[FIG. 5]
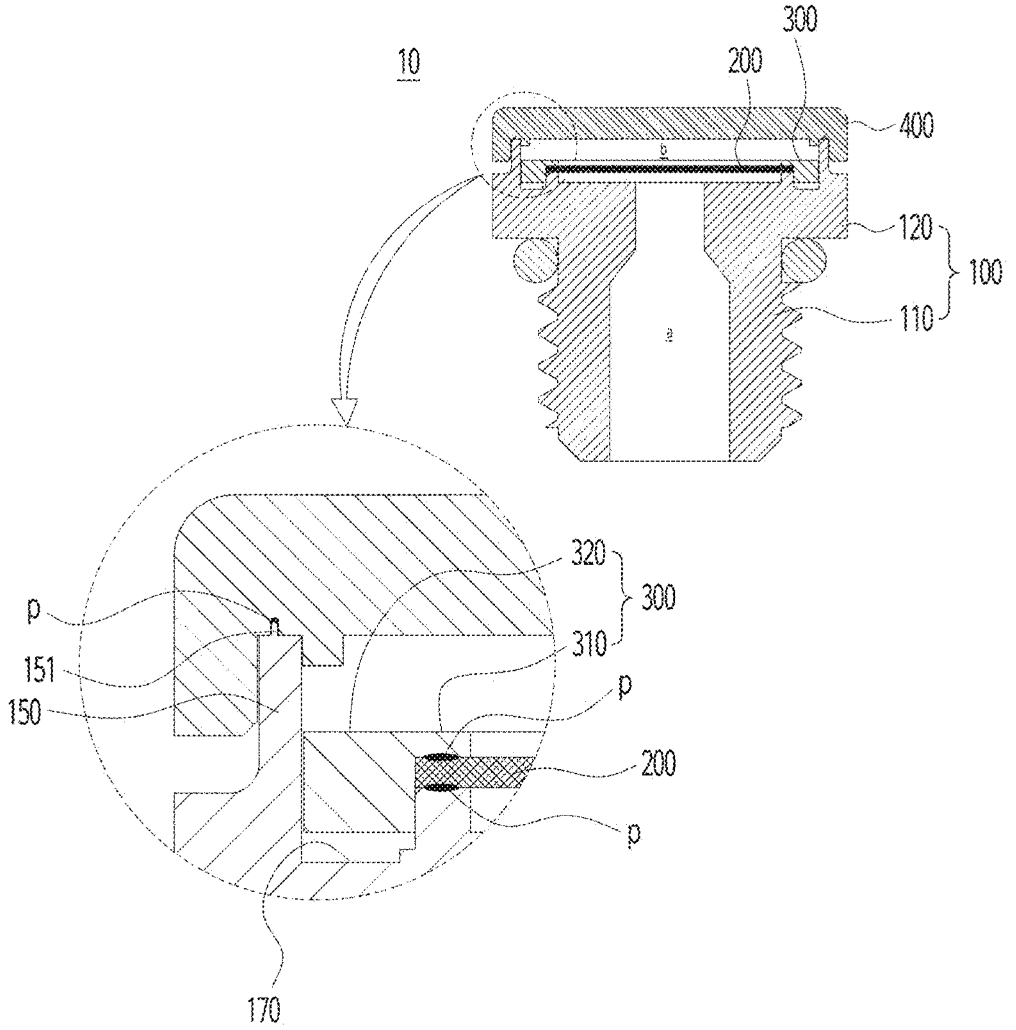

[FIG. 6]
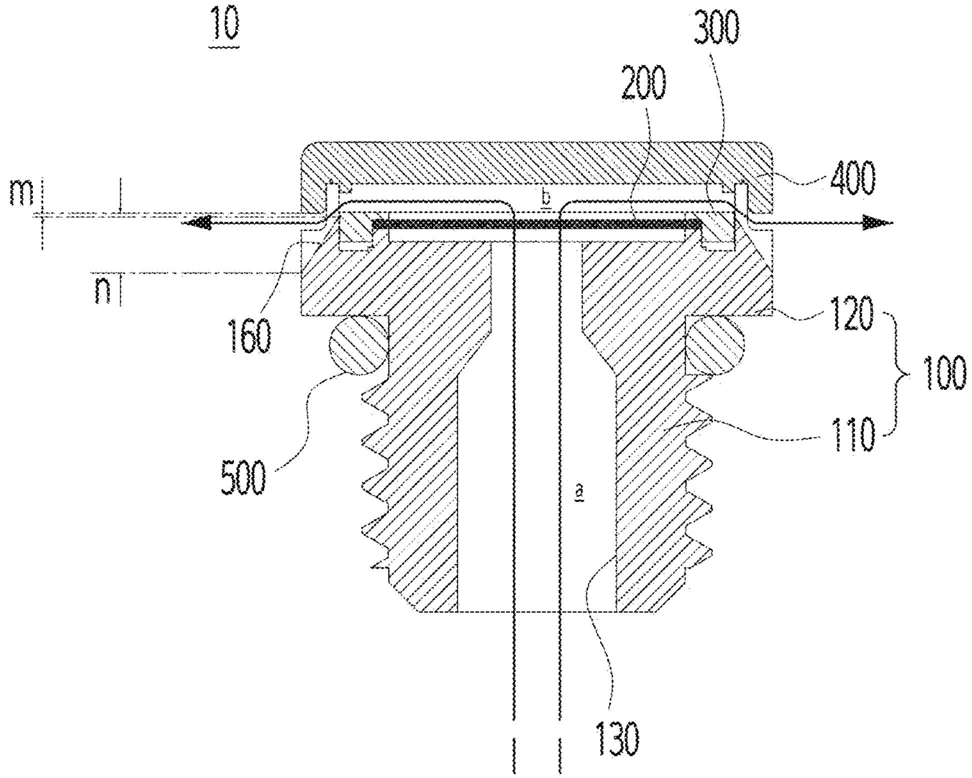

[FIG. 7A]
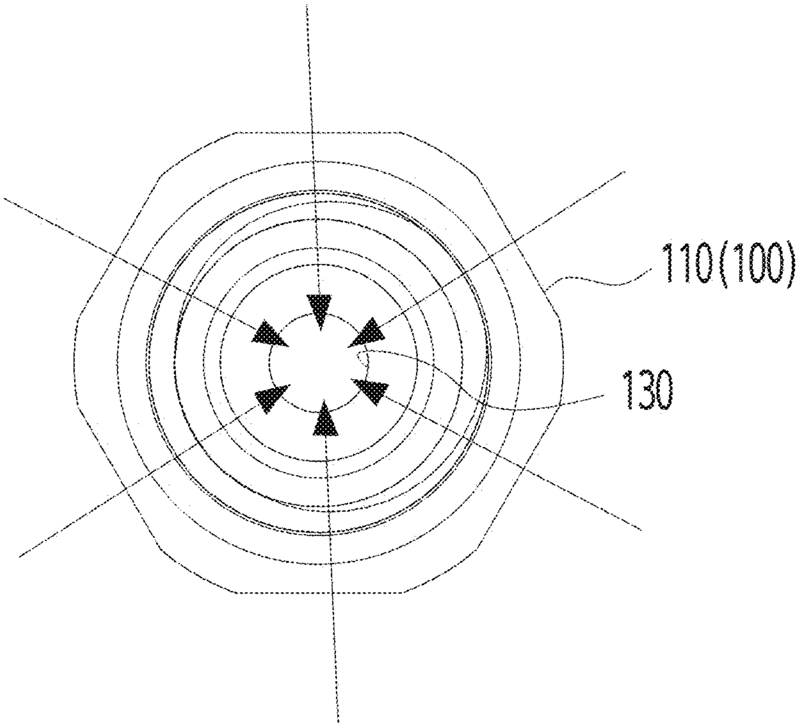

[FIG. 7B]
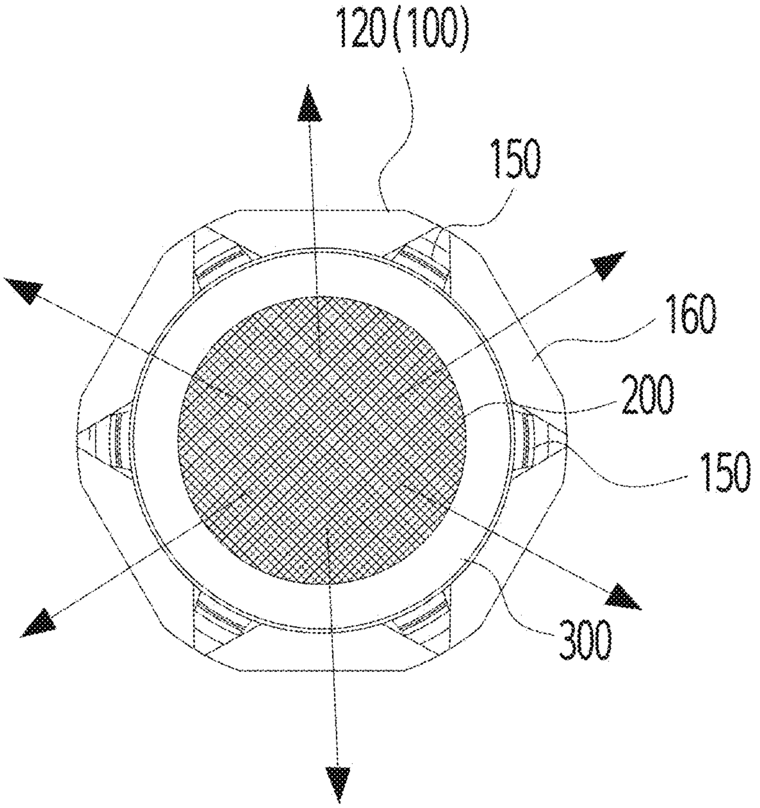

[FIG. 8]
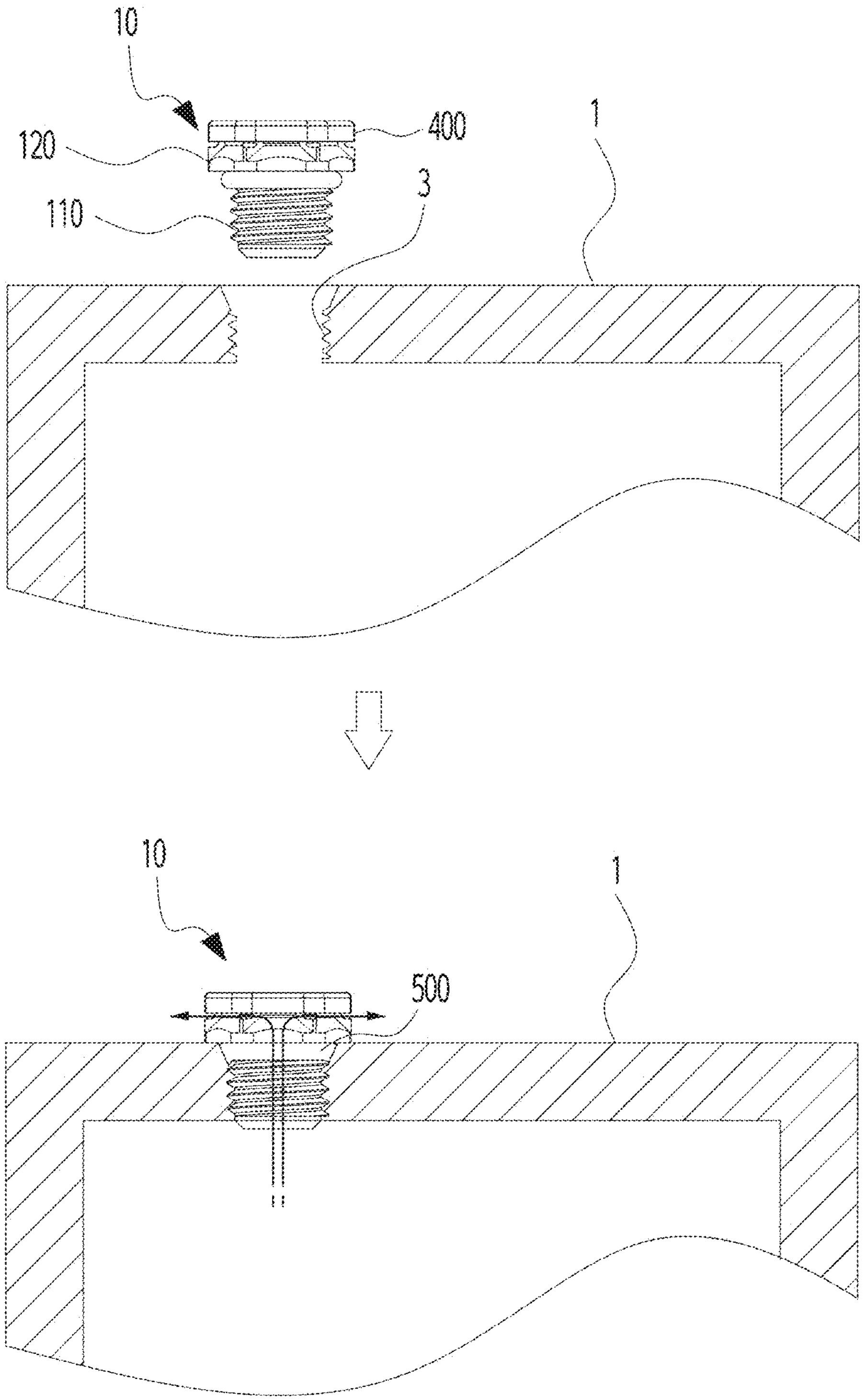

[FIG. 9]
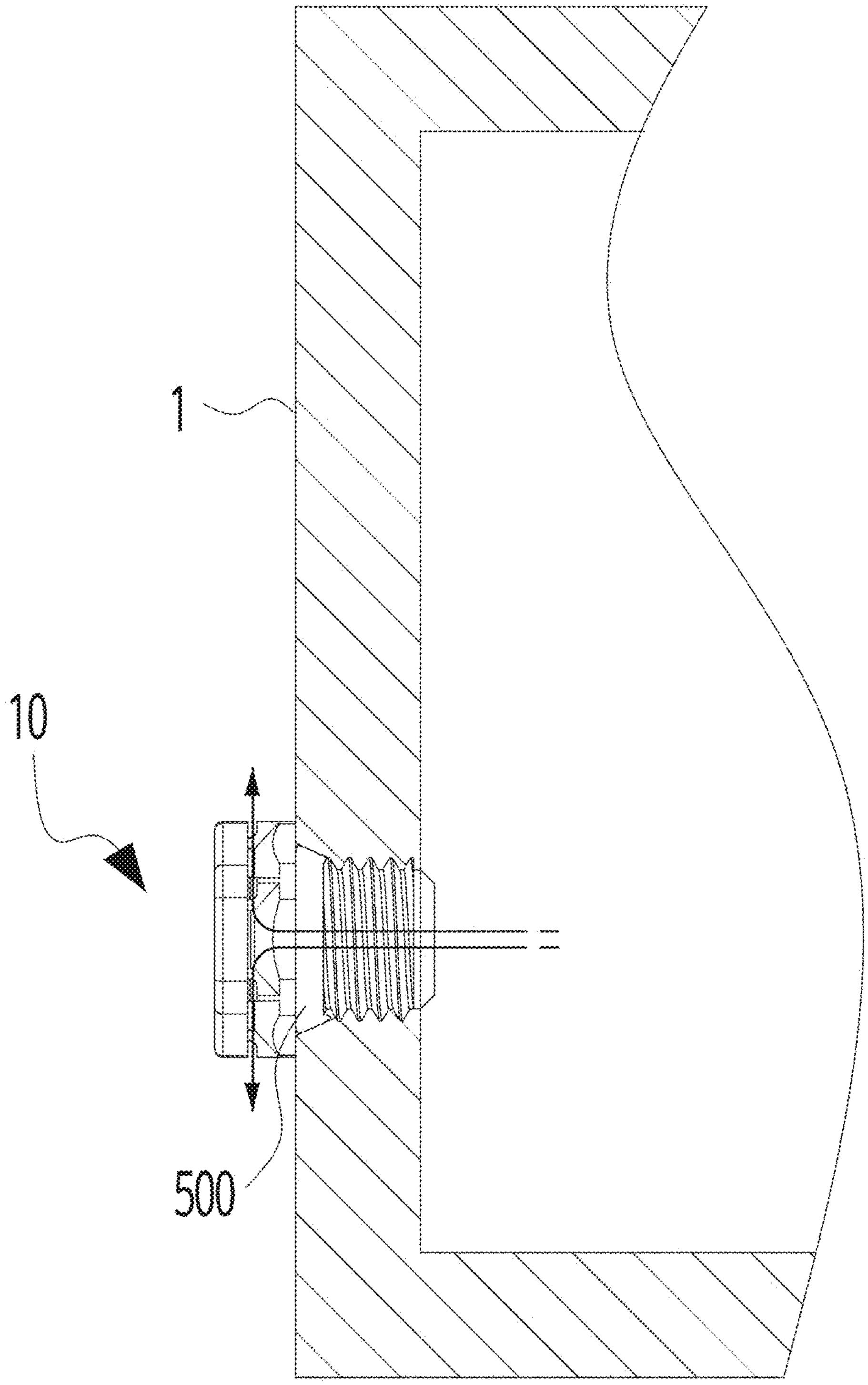

[FIG. 10]
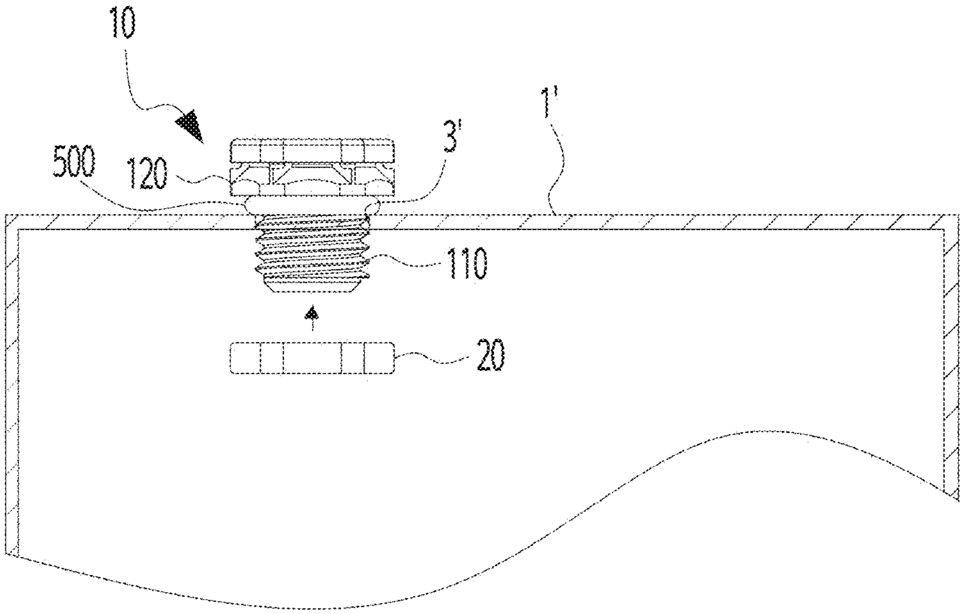

[FIG. 11]
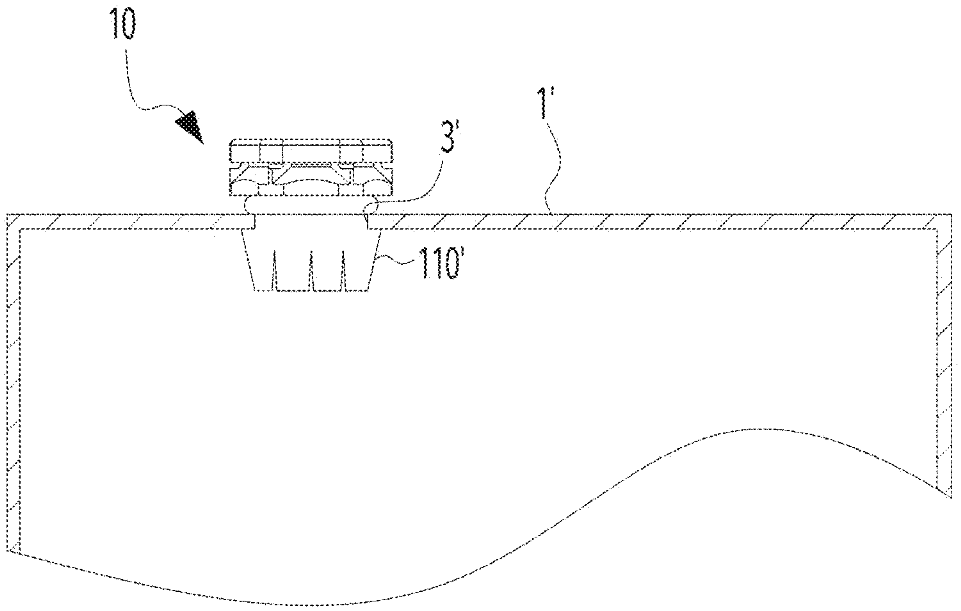

SCREW-TYPE VENT

TECHNICAL FIELD

The present disclosure relates to a screw-type vent, and to a screw-type vent installed on various electronic device casing bodies to prevent permeation of moisture and contamination particles and increase air permeability.

BACKGROUND ART

Electronic devices such as electronics, communications, automobiles, and security equipment in addition to LED lightings are built into a casing body, which is an external case, to extend their lifetimes, and ventilation holes are formed in the casing body to allow internal heat to be discharged to the outside.

However, the ventilation hole has an advantage of discharging heat generated from electronic devices inside the casing body to the outside to enable smooth ventilation, but there is a problem that moisture and contamination particles may permeate therein through the ventilation hole.

In addition, vehicle headlights or LED streetlights have a structure in which an LED light source is sealed with a transparent window to prevent the permeation of moisture and contamination particles, and in this case, heat generated from the LED light source causes a large temperature difference between inside and outside, resulting in moisture or condensation on the transparent window to make it difficult to secure illumination.

Therefore, a ventilation hole is formed in the transparent window that seals the electronic device casing or LED light source, and vents are installed in the ventilation hole to prevent the penetration of foreign substances or moisture and ensure ventilation.

However, conventional vents include a filter for preventing the permeation of a foreign substance, and a fixing member for fixing the filter is fixed to a vent body in a fitting or press-fit manner, and thus there is a problem of the filter being torn when the filter is thin.

The matters described above in the background art are intended to help understanding of the background of the disclosure and may include matters not related to the known related art.

SUMMARY OF INVENTION

Technical Problem

The present disclosure is directed to providing a screw-type vent installed on a transparent window that seals various electronic device casing bodies or an LED light source to prevent the permeation of moisture and contamination particles and increase air permeability.

In addition, the present disclosure is directed to providing a screw-type vent that effectively blocks the permeation of a foreign substance and moisture and maximizes air permeability by applying a membrane to a filter, and stably fixes the membrane at a correct location.

Solution to Problem

A screw-type vent according to an embodiment of the present disclosure for achieving the objects includes a body having a through-hole vertically passing through the center thereof, a seating protrusion formed on an upper surface of the body, and a membrane having an edge seated on the seating protrusion and disposed above the through-hole.

The screw-type vent further includes a fixing member seated on an upper edge of the membrane.

The membrane may be bonded to the seating protrusion and the fixing member in a thermal fusion manner.

The seating protrusion may have a ring shape.

The seating protrusion may have an inner diameter relatively larger than an inner diameter of the through-hole exposed to an upper surface of the body.

The membrane may have a flat plate shape and correspond to an outer diameter of the seating protrusion.

The fixing member may include a ring-shaped fixing part seated on the upper edge of the membrane, and a support part extending downward from an edge of the fixing part and in contact with a side surface of the seating protrusion.

A support rib may protrude from an upper edge of the body at an interval in a circumferential direction, a recessed groove that is recessed may be formed between the support rib and the seating protrusion, and the support part of the fixing member may be inserted into the recessed groove.

The body may include a lower body part and an upper flange part having a relatively large cross-sectional area compared to the body part, and an O-ring may be coupled to an outer circumferential surface of the body part.

The body part may have a screw shape or a snap-fit shape.

A support rib may protrude from an upper surface of the body at an interval along an edge of the body, and the support rib may be inserted into a bottom coupling groove of a cap member coupled to the body to protect the membrane.

The support rib of the body inserted into the bottom coupling groove of the cap member may be bonded to a bottom surface of the cap member in a thermal fusion manner.

A target protrusion for high-frequency targeting may be formed on an upper surface of the support rib.

In a state in which the cap member has been coupled to the body, the bottom surface of the cap member may be spaced apart from the membrane by the support rib, and the bottom surface of the cap member may be spaced apart from the upper surface of the body by the support rib.

The upper surface of the body corresponding to a gap between the support ribs may be formed to be inclined downward.

The upper surface of the body corresponding to a gap between the support ribs may have a width that is wider on the outside than on the inside.

The cap member may have a polygonal shape, and the support rib may be formed at a location corresponding to a vertex of a polygonal shape of the cap member.

The membrane may be made of an expanded polytetrafluoroethylene (ePTFE) material.

Advantageous Effects of Invention

According to the present disclosure, since the membrane is seated on the seating protrusion of the body, the fixing member is seated on the membrane, and then the membrane is fixed to the seating protrusion and the fixing member in a high-frequency thermal fusion manner by radiating the high frequency along the circumference of the fixing member, the thin membrane can be stably fixed to the body without damage.

In addition, according to the present disclosure, since the membrane is more effectively fixed to the body through the seating protrusion, and the fixing member is seated on the outer edge circumference of the membrane to prevent the separation of the membrane, the bonding target can be easily aligned during thermal fusion, thereby more efficiently performing the high-frequency thermal fusion operation.

In addition, according to the present disclosure, since the high-frequency thermal fusion can be performed at the correct location by adopting the target protrusion in the high-frequency thermal fusion process of the cap member and the body, it is possible to increase the reliability of the product.

In addition, according to the present disclosure, when the screw-type vent is installed on the casing body of the electronic device, it is possible to prevent harmful gases from accumulating inside the casing body or the heat generated from the electronic device from staying inside the casing body by blocking the permeation of moisture and contamination particles and maximizing air permeability, thereby preventing the casing body from being deformed or the electronic device inside the casing body from being damaged.

BRIEF DESCRIPTION OF DRAWINGS

FIG. 1 is a front view showing a screw-type vent according to an embodiment of the present disclosure.

FIG. 2 is an exploded perspective view showing the screw-type vent according to the embodiment of the present disclosure.

FIG. 3 is a perspective view showing a process in which a membrane and a fixing member are disposed on a seating protrusion of a body and thermally fused according to the embodiment of the present disclosure.

FIG. 4 is a perspective view showing the screw-type vent according to the embodiment of the present disclosure.

FIG. 5 is a cross-sectional view along line A-A in FIG. 4.

FIG. 6 is a cross-sectional view along line B-B in FIG. 4.

FIGS. 7A and 7B are views showing a path along which air flowing into a through-hole of the screw-type vent according to the embodiment of the present disclosure is discharged to the outside through a membrane part.

FIG. 8 is a cross-sectional view showing a state in which the screw-type vent according to the embodiment of the present disclosure is installed on an upper surface of a casing body.

FIG. 9 is a cross-sectional view showing a state in which the screw-type vent according to the embodiment of the present disclosure is installed on a side surface of the casing body.

FIG. 10 is a view for describing a method of fixing the screw-type vent according to the embodiment of the present disclosure to a thin casing body.

FIG. 11 is a view showing a state in which a screw-type vent according to another embodiment of the present disclosure is fixed to the casing body.

DESCRIPTION OF EMBODIMENTS

Hereinafter, exemplary embodiments according to the present disclosure will be described in detail with reference to the accompanying drawings.

FIG. 1 is a front view showing a screw-type vent according to an embodiment of the present disclosure, and FIG. 2 is an exploded perspective view showing the screw-type vent according to the embodiment of the present disclosure.

As shown in FIGS. 1 and 2, a screw-type vent 10 according to the embodiment of the present disclosure includes a body 100, a membrane 200, a fixing member 300, a cap member 400, and an O-ring 500.

The screw-type vent 10 is configured so that the membrane 200 and the fixing member 300 are disposed on an upper surface of the body 100, and the cap member 400 is disposed and fixed on the membrane 200 and the fixing member 300. The upper surface of the body 100 and a lower surface of the cap member 400 are separated by a support rib 150 to be described below. The separated portion between the upper surface of the body 100 and the cap member 400 forms a passage and an outlet through which air is discharged.

The body 100 includes a lower body part 110 and an upper flange part 120 whose cross-sectional area is relatively large compared to the body part 110. The body part 110 may be formed in a screw shape with a thread formed on an outer surface thereof and screw-coupled to a ventilation hole formed in a casing body, etc. The flange part 120 is formed to have a relatively large outer diameter compared to the body part 110. When the body part 110 is screw-coupled to the ventilation hole formed in the casing body, etc., the flange part 120 is in close contact with an outer circumferential surface of the casing body to support a state in which the body part 110 has been screw-coupled to the ventilation hole.

The body 100 has a through-hole 130 vertically passing through the center thereof. In an embodiment, the through-hole 130 is formed by passing through the body part 110 and the flange part 120, and the through-hole 130 becomes a first passage through which internal air moves to be discharged to the outside. The separated portion between the upper surface of the flange part 120 and the cap member 400 becomes a second passage. A boundary between the first passage and the second passage is formed by the membrane 200.

A seating protrusion 140 on which the membrane 200 is seated is formed on the upper surface of the body 100. The seating protrusion 140 is formed in a ring shape so that an edge of the membrane 200 is seated. The seating protrusion 140 is formed to have a predetermined height, a center thereof matches a center of the through-hole 130, and an inner diameter thereof is relatively large compared to an inner diameter of the through-hole 130 exposed to the upper surface of the body 100. The seating protrusion 140 separates the upper surface of the body 100 through which the through-hole 130 is exposed from the membrane 200 so that air may pass through a relatively large membrane area, thereby more effectively discharging internal heat.

The membrane 200 is disposed above the through-hole 130 to form a boundary between the first passage and the second passage. The membrane 200 is formed in a shape of a flat film or sheet. In an embodiment, the membrane 200 is formed to have an outer diameter corresponding to an outer diameter of the seating protrusion 140, and the edge thereof is seated on the seating protrusion 140 and disposed above the through-hole 130. The membrane 200 blocks moisture or a foreign substance from flowing into the first passage while discharging air from the first passage to the second passage.

The membrane 200 may be made of an expanded polytetrafluoroethylene (ePTFE) material. Since the ePTFE material is ultra-thin and has a thickness of only 0.25 mm, a size of the screw-type vent 10 can be minimized and the screw-type vent 10 can be easily applied to small electronic casing bodies. The membrane 200 effectively blocks the permeation of various sizes and types of solid particles and water and at the same time, allows air to easily pass therethrough.

In an embodiment, one membrane 200 is seated on the seating protrusion 140. However, one or more membranes may be seated on the seating protrusion according to design conditions.

The fixing member 300 is seated on an upper edge of the membrane 200. The fixing member 300 is seated on an upper outer edge of the membrane 200 to prevent the movement and separation of the membrane 200. That is, the fixing member 300 holds the edge of the membrane 200 to fix a location where the membrane 200 has been seated.

The membrane 200 is fixed to the seating protrusion 140 of the body 100 and the fixing member 300 through thermal fusion. Preferably, the membrane 200 is fixed by bonding the seating protrusion 140 and the fixing member 300 through high-frequency thermal fusion. When the membrane 200 is fixed by bonding the seating protrusion 140 and the fixing member 300 through thermal fusion without physical coupling, it is possible to prevent deformation, tearing, etc. of the membrane 200 and increase sealing properties.

When the membrane 200 is seated on the seating protrusion 140 and the location of the membrane 200 is fixed by fitting or press-fitting the fixing member 300 into the seating protrusion 140, there may be a problem that the membrane 200 is torn or its location is misaligned in a process of fitting the fixing member 300 into the seating protrusion 140 or a process of press-fitting the membrane 200. When the location of the membrane 200 is misaligned or the membrane 200 is torn, it is difficult for the membrane 200 to serve to prevent the permeation of moisture or a foreign substance.

In the present embodiment, in a state in which only the location of the membrane 200 has been aligned using the fixing member 300 without physically pressing the membrane 200, the membrane 200 is stably fixed to the seating protrusion 140 through thermal fusion using a high frequency. Since a high frequency may precisely control a thermally fused location, width, and depth, it is possible to increase sealing properties of the coupling portion and enable stable fixing by forming continuous thermally fused portions without any gap between the membrane 200 and the seating protrusion 140 and between the membrane 200 and the fixing member 300. In addition, the seating protrusion 140 enables a high-frequency target to be located at a correct location, thereby enabling reliable bonding.

Since the membrane 200 is fixed to the seating protrusion 140 and the fixing member 300 through thermal fusion, the alignment of the location where the membrane 200 is seated on the seating protrusion 140 is important, and the alignment of the location of the membrane 200 is performed by the fixing member 300.

Referring to FIG. 5, the fixing member 300 includes a ring-shaped fixing part 310 seated on the upper edge of the membrane 200, and a support part 320 that extends downward from the edge of the fixing part 310 and is in contact with a side surface of the seating protrusion 140. That is, the fixing member 300 may be formed to have a '¬'-shaped cross section to stably support the membrane 200 seated on the seating protrusion 140 so that a state in which the membrane 200 and the fixing member 300 have been aligned in location is maintained in the high-frequency thermal fusion process. That is, the fixing member 300 serves to locate the membrane 200 and the seating protrusion 140 and the membrane 200 and the fixing member 300 to be stably bonded through thermal fusion, thereby preventing damage to the membrane or poor bonding in the thermal fusion process. A part of the fixing member 300, which is thermally fused with the membrane 200, becomes the fixing part 310. The fixing part 310 has a predetermined height. This is intended to prevent moisture from being in direct contact with the membrane 200 by locating the membrane 200 inside the fixing part 310 when the screw-type vent 10 is installed on a side surface of a casing body 1, etc.

The body 100 as well as the seating protrusion 140 may be made of a plastic injection molding material (e.g., a polymer material), and the fixing member 300 may also be made of a plastic injection molding material. The plastic material and the membrane material may be stably bonded through thermal fusion.

FIG. 3 is a perspective view showing a process in which a membrane and a fixing member are disposed on a seating protrusion of a body and thermally fused according to the embodiment of the present disclosure.

As shown in FIG. 3, when the fixing member 300 is seated on the upper edge of the membrane 200, the fixing part 310 of the fixing member 300 is disposed on the upper surface of the membrane 200 and the support part 320 is disposed on the side surface of the seating protrusion 140 to become a structure that prevents the left-right movement of the support rib 150 to be described below.

The high-frequency thermal fusion is performed by radiating a high frequency along the circumference of the fixing part 310 of the fixing member 300, and the thermal fusion of the membrane 200 and the seating protrusion 140 and the membrane 200 and the fixing member 300 may be performed through primary or secondary high-frequency thermal fusion that controls a depth.

The support rib 150 protrudes upward at an interval along an upper edge of the body 100. The support rib 150 is provided for the coupling of the body 100 and the cap member 400 and the separation of the body 100 and the cap member 400. In an embodiment, a plurality of support ribs 150 are formed in a pillar shape at intervals along an upper edge of the flange part 120 of the body 100.

The cap member 400 is coupled to the body 100 to protect the membrane 200. The cap member 400 is formed to have an area corresponding to the flange part 120 of the body 100, and the cap member 400 has a coupling groove 410 corresponding to the support rib 150 of the body 100 on a bottom surface thereof to be fixed to the support rib 150. In addition, the cap member 400 has a structure in which a bottom edge portion protrudes further downward.

In a state in which a bottom surface of the cap member 400 is disposed to be seated on the support rib 150 of the body 100, the support rib 150 of the body 100 and the bottom surface of the cap member 400 are fixed through thermal fusion.

Specifically, the support rib 150 protrudes from the upper surface of the body 100 at an interval along the edge of the body 100, and the support rib 150 is inserted into the bottom coupling groove 410 of the cap member 400 coupled to the body 100 to protect the membrane 200. The support rib 150 of the body 100 inserted into the bottom coupling groove of the cap member 400 is fixed to the bottom surface of the cap member 400 through thermal fusion. Preferably, the support rib 150 of the body 100 inserted into the bottom coupling groove of the cap member 400 is fixed to the bottom surface of the cap member 400 through high-frequency thermal fusion.

A target protrusion 151 may be formed on an upper surface of the support rib 150 to facilitate high-frequency targeting. When there is a protrusion during high-frequency thermal fusion, high-frequency targeting is easy, and it is easy to perform thermal fusion by radiating a high frequency to a desired location.

In a state in which the cap member 400 has been fixed to the support rib 150 of the body 100, the bottom surface of the cap member 400 is separated from the membrane 200 and the upper surface of the body 100. The separated portion between the body 100 and the cap member 400 forms a passage and an outlet through which air is discharged. That is, the screw-type vent 10 has a structure in which air moving upward is discharged through the side surfaces thereof.

The cap member 400 has a polygonal shape, and the support rib 150 is formed at a location corresponding to a vertex of the polygonal shape of the cap member 400. In addition, the coupling groove 410 is formed on a bottom surface of the location corresponding to the vertex of the polygonal shape of the cap member 400. This makes it easy to align the location during coupling by allowing the support rib 150 to be smoothly inserted into the coupling groove 410 when the cap member 400 is coupled to the body 100 by matching only the vertex location of the body 100.

The upper surface of the body 100 corresponding to a gap between the support rib 150 and the support rib 150 forms an inclined surface 160 that is inclined downward. The inclined surface 160 has an outer width larger than an inner width. That is, an outlet of the screw-type vent 10 has a shape in which a width gradually increases from the inside to the outside. This may allow the heated air inside the casing body in which the screw-type vent 10 is installed to be quickly discharged to the outside and prevent the introduction of external moisture or foreign substance.

The screw-type vent 10 seats the membrane 200 on the seating protrusion 140 of the body 100, seats the fixing member 300 on the edge of the membrane 200, and then radiates a high frequency along the circumference of the fixing part 310 of the fixing member 300 so that the fixing part 310 of the fixing member 300 and the membrane 200 and the membrane 200 and the seating protrusion 140 are fixed through thermal fusion. The seating protrusion 140 also serves to facilitate high frequency targeting. When there is a protrusion during high-frequency thermal fusion, high-frequency targeting is easy, and it is easy to perform thermal fusion by radiating a high frequency to a desired location. Next, the cap member 400 is seated on the support rib 150 of the body 100 so that the support rib 150 is inserted into the bottom coupling groove 410 of the cap member 400. Next, a high frequency is radiated to the upper surface of the cap member 400 so that the support rib 150 and the bottom surface of the cap member 400 corresponding to the coupling groove 410 are fixed through thermal fusion. The screw-type vent 10 is manufactured through the above process.

FIG. 4 is a perspective view showing the screw-type vent according to the embodiment of the present disclosure, FIG. 5 is a cross-sectional view along line A-A in FIG. 4, and FIG. 6 is a cross-sectional view along line B-B in FIG. 4.

As shown in FIGS. 4 to 6, the screw-type vent 10 has the body part 110 of the body 100 with a screw shape in which a thread is formed on the outer circumferential surface thereof, and the flange part 120 of the body 100 and the cap member 400 are formed as a bolt forming a head portion of the screw. In the screw-type vent 10, the through-hole 130 is formed by passing through the body part 110 and the flange part 120, the flange part 120 and the cap member 400 are spaced apart by the support rib 150, and the support ribs 150 are spaced apart so that air passing through the through-hole 130 may be discharged through a gap between the separated support ribs 150.

In addition, since the gap between the support ribs 150 has a shape including the inclined surface that is inclined downward toward the outside and a width thereof has a shape that gradually increases from the inside to the outside, the heated air inside the body in which the screw-type vent 10 has been installed can be quickly discharged to the outside, and the introduction of external moisture or foreign substance can be prevented.

As shown in FIG. 5, in the screw-type vent 10, since the membrane 200 is fixed to the seating protrusion 140 and the fixing part 310 of the fixing member 300 through high-frequency thermal fusion, the membrane 200 may be stably disposed at a boundary between a first passage a formed by the through-hole 130 and a second passage b formed by the flange part 120 of the body 100 and the cap member 400. In addition, since a thermally fused portion p in which the membrane 200, the seating protrusion 140, and the fixing part 310 are thermally fused is formed in a line shape along the circumference of the fixing part 310, no gap occurs and airtightness is maintained, and thus moisture or a foreign substance may not flow into the first passage a. Furthermore, the support part 320 of the fixing member 300 has a structure that supports the side surfaces of the membrane 200 and the side surfaces of the seating protrusion 140 and is inserted between the support rib 150 and the seating protrusion 140, and thus may fix the membrane 200 more stably and also help maintain airtightness.

In an embodiment, a recessed groove 170 is formed between the support rib 150 and the seating protrusion 140, and the support part 320 of the fixing member 300 is inserted into the recessed groove 170.

As shown in FIG. 6, the screw-type vent 10 forms an outlet laterally by separating the flange part 120 of the body 100 and the cap member 400, and the outlet has a relatively large outer interval n compared to an inner interval m. Therefore, as marked by the arrow, inner air may be quickly discharged to the outside in the lateral direction of the screw-type vent 10.

It is preferable that an interval of the second passage b formed by separating the flange part 120 of the body 100 and the cap member 400 is relatively small compared to the inner interval m of the outlet. The through-hole 130 that becomes the first passage a may be formed to have a large inner diameter in the body part 110 and formed to have a relatively small inner diameter in the flange part 120.

FIGS. 7A and 7B are views showing a path along which air flowing into a through-hole of the screw-type vent according to the embodiment of the present disclosure is discharged to the outside through a membrane part.

As shown in FIGS. 7A and 7B, since a size of the membrane 200 as viewed from the upper surface of the body 100 is relatively large compared to a size of the through-hole 130 as viewed from the bottom surface of the body 100, the inner air may be quickly discharged to the outside through the membrane 200. In addition, since the interval between the support ribs 150 has an outer side relatively larger than an inner side and has a trapezoidal shape that increases from the inside to the outside, the heated air therein may be effectively discharged to the outside in the lateral direction of the screw-type vent 10.

The screw-type vent 10 may be integrally formed by injection molding so that the body 100 has the seating protrusion 140 and the support rib 150. In addition, the cap member 400 may be formed to have the coupling groove 410 on the bottom surface thereof. The membrane 200 may be made of a material that may serve as a filter, for example, an ePTFE material. The membrane 200 is formed in a flat shape corresponding to the outer diameter of the seating protrusion 140.

The fixing member 300 may be formed by injection molding to have the fixing part 310 and the support part 320 that extends orthogonally downward from an end portion of the fixing part 310. The fixing member 300 is configured so that the inner diameter of the support part 320 corresponds to the outer diameter of the membrane 200 so that the inner diameter of the support part 320 may support the outer diameter of the membrane 200. The O-ring 500 may be made of an elastic material, for example, one of a silicon material and a rubber material and coupled to the outer surface of the body part 110 of the body 100.

As described above, according to the embodiment of the present disclosure, it is possible to more effectively fix the membrane 200 to the body 100 through the seating protrusion 140, and the fixing member 300 is seated on the circumference of the outer edge of the membrane 200 to prevent the separation of the membrane, and thus it is easy to align the bonding target, thereby facilitating high-frequency thermal fusion. In addition, it is possible to perform the high-frequency thermal fusion at the correct location by adopting the target protrusion in the high-frequency thermal fusion process, thereby enhancing product reliability.

In addition, since the flange part 120 of the body 100 according to the embodiment of the present disclosure has a shape with a widened outlet width, the internal heat can be discharged more effectively.

FIG. 8 is a cross-sectional view showing a state in which the screw-type vent according to the embodiment of the present disclosure is installed on an upper surface of a casing body, and FIG. 9 is a cross-sectional view showing a state in which the screw-type vent according to the embodiment of the present disclosure is installed on a side surface of the casing body.

As shown in FIGS. 8 and 9, the screw-type vent 10 may be screw-coupled to a ventilation hole 3 formed in the casing body 1. To this end, a thread is formed in the ventilation hole of the casing body 1. In addition, an inclined portion into which the O-ring 500 of the screw-type vent 10 may be in close contact by being inserted may be formed in the ventilation hole 3.

In a state in which the screw-type vent 10 has been screw-coupled to the ventilation hole 3 formed in the casing body 1, the O-ring 500 may be in close contact with the inclined portion of the ventilation hole 3 to increase the airtightness of the ventilation hole, and the flange part 120 of the body 100 is in close contact with an outer circumference of the ventilation hole 3 of the casing body 1. In this state, the air inside the casing body 1 may move upward through the through-hole of the screw-type vent 10, then pass through the membrane, and may be discharged to the outside in the lateral direction of the screw-type vent 10. In addition, outside air may flow therein in the lateral direction of the screw-type vent 10, then pass through the membrane, then flow into the through-hole, and flow into the casing body 1. When the outside air flows into the casing body 1 through the screw-type vent 10, moisture or a foreign substance does not pass through the membrane, and thus the moisture or the foreign substance does not flow into the casing body 1, and only air may circulate.

In addition, as shown in FIG. 9, even when the screw-type vent 10 is installed on the side surface of the casing body 1, air is discharged in the lateral direction of the screw-type vent 10 through the through-hole of the screw-type vent 10, and air introduced in the lateral direction of the screw-type vent 10 may pass through the membrane and the through-hole and flow into the casing body 1. In this process, even when the outlet of the screw-type vent 10 faces upward and downward, the membrane may have a structure that is located therein by the fixing member 300, thereby preventing moisture from flowing into the membrane.

FIG. 10 is a view for describing a method of fixing the screw-type vent according to the embodiment of the present disclosure to a thin casing body.

As shown in FIG. 10, the screw-type vent 10 according to the embodiment of the present disclosure may be fixed to a casing body 1' by inserting the body part 110 into a ventilation hole 3' of a casing body 1' and then fastening a nut member 20 to the thread of the body part 110 passing through the ventilation hole 3'. In this case, the O-ring 500 may be compressed between an outer circumferential surface of the ventilation hole 3' of the casing body 1' and the bottom surface of the flange part 120, thereby securing the airtightness of the ventilation hole 3'.

FIG. 11 is a view showing a state in which a screw-type vent according to another embodiment of the present disclosure is fixed to the casing body.

As shown in FIG. 11, a screw-type vent 10' according to another embodiment may have a body part 110' in a snap-fit shape. When the body part 110' has the snap-fit shape, the screw-type vent 10' may be easily mounted by being fitted into the ventilation hole 3' of the casing body 1'.

The above-described screw-type vents of the embodiment and another embodiment of the present disclosure may be installed in the ventilation hole of the electronic device casing body 1 to quickly discharge heat generated from the electronic device inside the casing body 1 to the outside, can protect the electronic device inside the casing body 1 by preventing moisture from cooling or moisture from condensing inside the casing body 1 through air circulation between the inside and the outside, and prevent a foreign substance or moisture from permeating the casing body 1.

The above-described screw-type vent according to the embodiment of the present disclosure can be stably fixed by adopting the thin membrane, and thus can be manufactured in an ultra-small size with a total height of 16 mm, a height of the body part of 10 mm, the outer diameter of the cap member and the flange part of 17 mm, and the outer diameter of the body part of 10 mm. Therefore, the screw-type vents according to the embodiments of the present disclosure can be easily applied to a small casing body with a narrow installation space and can secure an extra space inside and outside the casing body, thereby contributing to doubling the performance of electronic devices by additionally installing additional components in the casing body.

The above description is merely the exemplary description of the technical spirit of the present disclosure, and those skilled in the art to which the present disclosure pertains will be able to variously modify and change the present disclosure without departing from the essential characteristics of the present disclosure. Therefore, the embodiments disclosed in the present disclosure are not intended to limit the technical spirit of the present invention, but intended to describe the same, and the scope of the technical spirit of the present disclosure is not limited by these embodiments. The scope of the present disclosure should be construed by the appended claims, and all technical spirits within the equivalent scope should be construed as being included in the scope of the present disclosure.

The invention claimed is:

1. A screw-type vent comprising:

a body having a through-hole vertically passing through the center thereof;

a seating protrusion formed on an upper surface of the body;

a membrane having an edge seated on the seating protrusion and disposed above the through-hole; and a fixing member seated on an upper edge of the membrane, wherein the fixing member includes:

a ring-shaped fixing part seated on the upper edge of the membrane; and a support part extending downward from an edge of the fixing part and in contact with a side surface of the seating protrusion.

2. The screw-type vent of claim 1, wherein the membrane is bonded to the seating protrusion and the fixing member in a thermal fusion manner.

3. The screw-type vent of claim 1, wherein the seating protrusion has a ring shape.

4. The screw-type vent of claim 1, wherein the seating protrusion has an inner diameter larger than an inner diameter of the through-hole exposed to an upper surface of the body.

5. The screw-type vent of claim 1, wherein the membrane has a flat plate shape, and corresponds to an outer diameter of the seating protrusion.

6. The screw-type vent of claim 1, wherein a support rib protrudes from an upper edge of the body at an interval in a circumferential direction, and a recessed groove that is recessed is formed between the support rib and the seating protrusion, and the support part of the fixing member is inserted into the recessed groove.

7. The screw-type vent of claim 1, wherein the body includes a lower body part and an upper flange part having a larger cross-sectional area than the lower body part, and an O-ring is coupled to an outer circumferential surface of the lower body part.

8. The screw-type vent of claim 7, wherein the lower body part has a screw shape or a snap-fit shape.

9. The screw-type vent of claim 1, wherein the membrane is made of an expanded polytetrafluoroethylene (ePTFE) material.

10. A screw-type vent comprising:

a body having a through-hole vertically passing through the center thereof;

a seating protrusion formed on an upper surface of the body; and a membrane having an edge seated on the seating protrusion and disposed above the through-hole, wherein a support rib protrudes from an upper surface of the body at an interval along an edge of the body, and the support rib is inserted into a bottom coupling groove of a cap member coupled to the body to protect the membrane.

11. The screw-type vent of claim 10, wherein the support rib of the body inserted into the bottom coupling groove of the cap member is bonded to a bottom surface of the cap member in a thermal fusion manner.

12. The screw-type vent of claim 10, wherein a target protrusion for high-frequency targeting is formed on an upper surface of the support rib.

13. The screw-type vent of claim 10, wherein, in a state in which the cap member has been coupled to the body, the bottom surface of the cap member is spaced apart from the membrane by the support rib, and the bottom surface of the cap member is spaced apart from the upper surface of the body by the support rib.

14. The screw-type vent of claim 10, wherein the upper surface of the body corresponding to a gap between the support ribs is formed to be inclined downward.

15. The screw-type vent of claim 10, wherein the upper surface of the body corresponding to a gap between the support ribs has a width that is wider on the outside than on the inside.

16. The screw-type vent of claim 10, wherein the cap member has a polygonal shape, and the support rib is formed at a location corresponding to a vertex of a polygonal shape of the cap member.

* * * * *